(12) United States Patent
Narayana et al.

(10) Patent No.: US 7,773,003 B1
(45) Date of Patent: Aug. 10, 2010

(54) HUFFMAN SEARCH ALGORITHM FOR AAC DECODER

(75) Inventors: Srinidhi Thirumalae Narayana, Bangalore (IN); Shyam Krishnan Moni, Coimbatore (IN)

(73) Assignee: Freescale Semiconductor, Inc., Austin, TX (US)

( * ) Notice: Subject to any disclaimer, the term of this patent is extended or adjusted under 35 U.S.C. 154(b) by 48 days.

(21) Appl. No.: 12/398,189

(22) Filed: Mar. 5, 2009

(51) Int. Cl.
*H03M 7/40* (2006.01)
(52) U.S. Cl. .......................................... 341/65; 341/67
(58) Field of Classification Search .................. 341/65, 341/67; 382/303; 348/384; 712/209, 18; 380/46
See application file for complete search history.

(56) References Cited

U.S. PATENT DOCUMENTS

| 6,765,513 B2 * | 7/2004 | Sundareson ................... 341/67 |
| 7,002,494 B2 | 2/2006 | Singhal et al. |

\* cited by examiner

*Primary Examiner*—Rexford N Barnie
*Assistant Examiner*—Joseph Lauture
(74) *Attorney, Agent, or Firm*—Charles Bergere

(57) ABSTRACT

A method for decoding an input bit stream encoded using Huffman encoding generates a lookup table using a standard Huffman code book. Thereafter, at least three bits are extracted from the input bit stream. The at least three bits extracted are used to traverse the lookup table. Subsequently, a data set corresponding to a Huffman code word is accessed, thereby decoding the input bit stream.

20 Claims, 9 Drawing Sheets

FIG. 3

| Index | Length | Huffman Codeword |
|---|---|---|
| 40 | 1 | 0x0 |
| 67 | 5 | 0x10 |
| 13 | 5 | 0x11 |
| 39 | 5 | 0x12 |
| 49 | 5 | 0x13 |
| 41 | 5 | 0x14 |
| 37 | 5 | 0x15 |
| 43 | 5 | 0x16 |
| 31 | 5 | 0x17 |
| 4 | 7 | 0x68 |
| 10 | 7 | 0x72 |

FIG. 1 - Prior Art -

| Index | Length | Huffman Codeword |
|---|---|---|
| 0 | 11 | 7f8 |
| 1 | 9 | 1f1 |
| 2 | 11 | 7fd |
| 3 | 10 | 3f5 |
| 4 | 7 | 68 |
| 5 | 10 | 3f0 |
| 6 | 11 | 7f7 |
| 7 | 9 | 1ec |
| 8 | 11 | 7f5 |
| 9 | 10 | 3f1 |
| 10 | 7 | 72 |

- Prior Art -

FIG. 4A

| Row/column index | 402a<br>000 | 402b<br>001 | 402c<br>010 | 402d<br>011 | 402e<br>100 | 402f<br>101 | 402g<br>110 | 402h<br>111 |
|---|---|---|---|---|---|---|---|---|
| 0 (404a) | 0x5 | 0x5 | 0x5 | 0x5 |  |  |  |  |
| 1 (404b) | 0 | 0 | 0 | 0 |  |  |  |  |

FIG. 4B

| Row/column index | 402a<br>000 | 402b<br>001 | 402c<br>010 | 402d<br>011 | 402e<br>100 | 402f<br>101 | 402g<br>110 | 402h<br>111 |
|---|---|---|---|---|---|---|---|---|
| 0 (404a) | 0x5 | 0x5 | 0x5 | 0x5 | 0x4 | 0 | 0 | 0 |
| 1 (404b) | 0 | 0 | 0 | 0 | 0 |  |  |  |
| 2 (404c) | 0x3 | 0x3 | 0 | 0 |  |  |  |  |
| 3 (404d) | 1 | 0 | 0 | 0 |  |  |  |  |

| Row/column index | 000 | 001 | 010 | 011 | 100 | 101 | 110 | 111 |
|---|---|---|---|---|---|---|---|---|
| 0 | 0x5 | 0x5 | 0x5 | 0x5 | 0x4 | 0xa | 0x10 | 0x12 |
| 1 | 0 | 0 | 0 | 0 | 0 | 0 | 0 | 0 |
| 2 | 0x3 | 0x3 | 0xb | 0xb | 0x13 | 0x13 | 0x1b | 0x1b |
| 3 | 1 | 0 | 0 | 0 | -1 | 0 | 0 | 0 |
| 4 | 0 | 0 | 0 | 0 | 0 | 1 | 0 | 0 |
| 5 | 0x3 | 0x3 | 0xb | 0xb | 0x13 | 0x13 | 0x1b | 0x1b |
| 6 | 0 | 0 | 0 | 1 | 0 | 0 | -1 | 0 |
| 7 | 0 | 0 | 1 | 0 | 0 | -1 | 0 | 0 |
| 8 | 0x4 | 0x8 | 0xc | 0x10 | 0x14 | 0x18 | 0x1c | 0x20 |
| 9 | 0x22 | 0x26 | 0x2a | 0x2e | 0x32 | 0x3c | 0x46 | 0x50 |
| 10 | 0x5 | 0x5 | 0x5 | 0x5 | 0xd | 0xd | 0xd | 0xd |
| 11 | 1 | -1 | 0 | 0 | -1 | 1 | 0x0 | 0x0 |

FIG. 4C

HUFFMAN SEARCH ALGORITHM FOR AAC DECODER

BACKGROUND OF THE INVENTION

The present invention relates generally to decoding algorithms, and more specifically, to the decoding algorithms used in a Huffman decoder.

Recently there has been a consistent rise in the demand for data transmission at low bit rates. In addition, there has been an increasing demand for reduction in data storage space. To cater to these requirements, various compression algorithms such as Huffman coding, discrete cosine transform (DCT), entropy coding and run-length coding have become popular compression techniques. Among the compression techniques mentioned above, a combination of Huffman and run-length coding is preferably used for compression. The preference is attributed to better compression ratios achieved by the above combination in which the data symbols are encoded as variable length Huffman code words. The lengths of the Huffman code words are in proportion to the estimated probabilities of occurrences of the data symbols in the data to be encoded. As a result, the data symbol that occurs frequently has a Huffman code word with a length shorter than the length of a Huffman code word that represents a data symbol with a low probability of occurrence, thereby achieving compression.

An essential component of Huffman encoding is the use of Huffman code books that include mapping of the data symbols and the Huffman code words that are used to represent the data symbols. Various encoding standards specify varying numbers of Huffman code books having varying content. For example, the Advanced Audio Coding (AAC) encoding standard has specified 12 Huffman code books, Moving Picture Experts Group-1 Audio Layer 3 (MP3) encoding standard has specified 34 Huffman code books, and Joint Photographic Experts Group (JPEG) has specified 2 Huffman code books. These Huffman code books are used by Huffman decoders, such as an AAC decoder, to decode an encoded bit stream.

FIG. 1 is a table 100 illustrating a part of Huffman code book 1 specified by the AAC standard. The table 100 includes a plurality of Huffman code words in hexadecimal format, a plurality of lengths associated with a binary representation of each of the Huffman code words, and a plurality of index values associated with each of the Huffman code words. The index values are used to calculate quantized spectral coefficients using an equation specified by the AAC standard.

FIG. 2 is a flow chart illustrating a conventional method for decoding an encoded input bit stream. At step 202, an input bit stream is received. At step 204, a first bit is extracted from the input bit stream. At step 206, a search is performed in the Huffman code book 1 illustrated in FIG. 1, for identifying a Huffman code word matching the first extracted bit. At step 208, a check is performed to determine whether a Huffman code word matching the first extracted bit is identified. If it is determined at step 208 that a Huffman code word has been identified during the search, step 210 is performed. At step 210, an index value associated with the identified Huffman code word is read from the table 100. Step 212 is performed after step 210. At step 212, the index value is used to calculate quantized spectral coefficients using an equation specified by the AAC standard.

However, at step 208, if it is determined that a Huffman code word has not been identified in the search, step 214 is performed. At step 214, a second bit is extracted from the input bit stream and then at step 216, the second bit is appended to the first bit. For example, if a first extracted bit has a binary value '1' and a second extracted bit has a binary value '0', the second extracted bit, i.e. '0' will be appended to the first extracted bit '1' resulting in a combination '10'. Thereafter, steps 206 onwards are repeated using '10' as a search parameter. The above procedure of extracting a bit and appending it to the previously extracted bits is repeated until a matching Huffman code word is obtained.

The above method of decoding an input bit stream involves extraction of a single bit per decoding cycle. Thus, a large number of decoding cycles are required to decode the input bit stream. Large numbers of decoding cycles results in a high Million Instructions Per Second (MIPS) value. Further, large numbers of decoding cycles increases execution time.

It would be advantageous to be able to improve the efficiency of the decoding cycle, improve MIPS value, and decrease execution time.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 1 is a table illustrating a part of a standard Huffman code book specified by the AAC standard;

FIG. 3 is a table illustrating a part of a standard Huffman code book specified by an AAC standard, in accordance with an embodiment of the present invention;

FIGS. 4A, 4B, and 4C are a lookup table in various stages of generation, in accordance with an embodiment of the present invention;

DETAILED DESCRIPTION OF THE INVENTION

Figure 2:
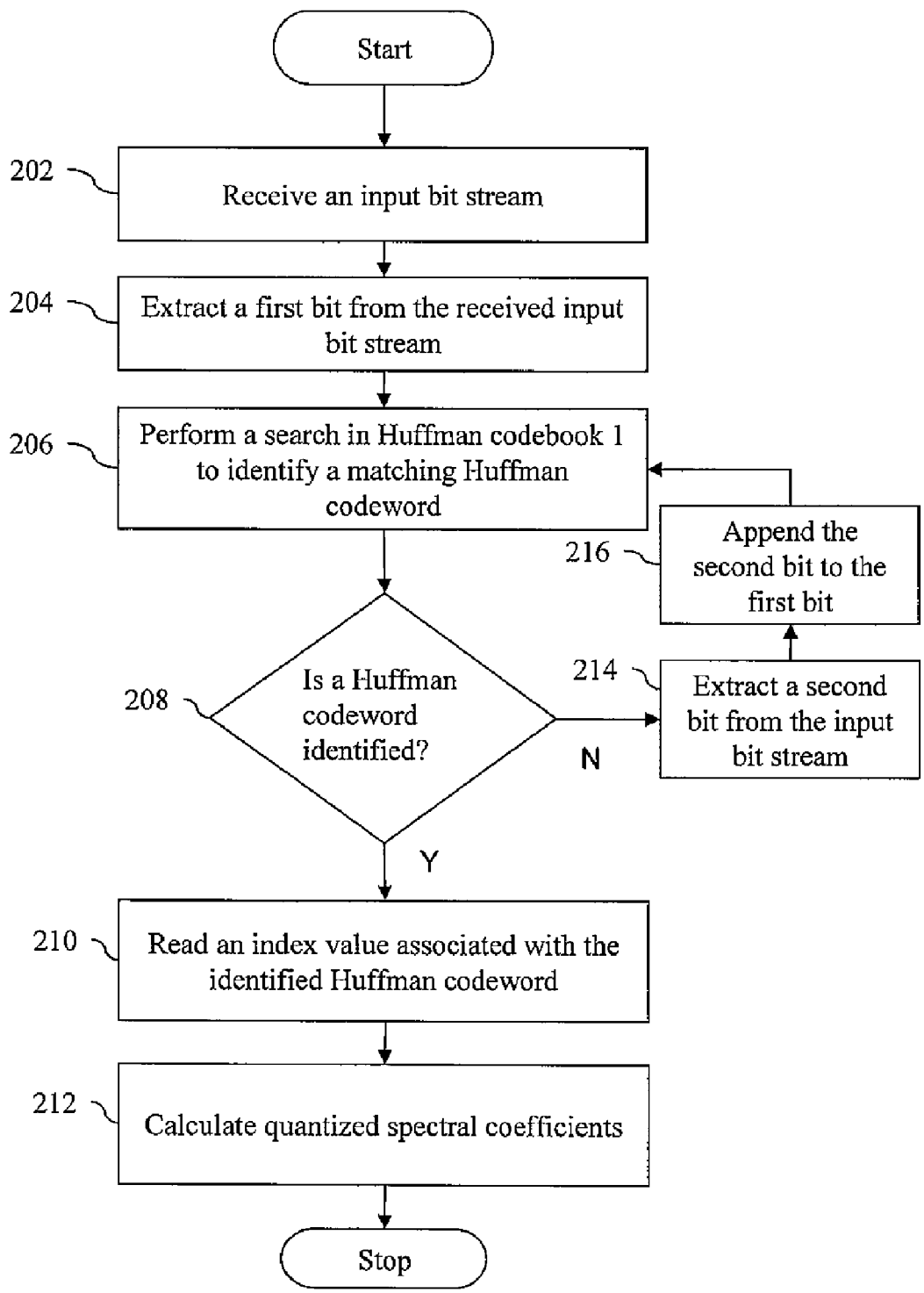
FIG. 2 is a flow chart illustrating a conventional method for decoding an input bit stream.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for generating a lookup table using a standard Huffman code book is provided. The standard Huffman code book includes a plurality of Huffman code words. The method for generating the lookup table includes dividing the standard Huffman code book into a plurality of groups based on a length of the Huffman code words. Each of the plurality of groups includes Huffman code words having equal lengths. A group is selected from the plurality of groups that includes Huffman code words having a predetermined length. Thereafter, a Huffman code word having a predetermined numerical value is selected from the selected group. Subsequently, the lookup table is generated based on the selected Huffman code word. The lookup table generated includes at least one data set, which further includes decoded data corresponding to a Huffman code word. Furthermore, the lookup table includes at least one terminal value that refers to the data set. The at least one terminal value includes one or more offset bits representing row offset of the at least one data set.

In another embodiment of the present invention, a method for decoding an input bit stream encoded using Huffman encoding using a lookup table is provided. The lookup table includes at least one data set, which includes a decoded data corresponding to a Huffman code word. The lookup table also includes at least one terminal value that refers to the at least one data set. The at least one terminal value includes one or more offset bits representing row offset of the at least one data set. The decoding method includes receiving the input bit stream. Thereafter, at least three bits are extracted from the received input bit stream. The lookup table is traversed based on the at least three bits extracted to access the at least one terminal value. Subsequently, the at least one data set is accessed using the at least one terminal value.

In yet another embodiment of the present invention, a system for decoding an input bit stream encoded using Huffman encoding is provided. The system includes a processor for decoding the input bit stream. Further, the system includes a memory coupled to the processor for storing a lookup table. The lookup table includes at least one data set, which is decoded data corresponding to a Huffman code word. The lookup table also includes at least one terminal value that refers to the at least one data set. The at least one terminal value includes one or more offset bits representing a row offset of the at least one data set.

Various embodiments of the present invention provide a method for decoding an input bit stream encoded using Huffman encoding using a lookup table. The lookup table is generated using a standard Huffman code book. Thereafter, at least three bits are extracted from the input bit stream. The lookup table is traversed based on the extracted three bits to access a data set corresponding to the extracted bits, thereby decoding the input bit stream.

The method above for decoding an input bit stream reduces the number of traversals of the lookup table by extracting three bits simultaneously, thereby reducing MIPS. Further, row addresses that are accessed during the lookup table traversal are stored as relative row offsets. The row addresses when denoted as relative row offsets require fewer numbers of bits for storage than the number of bits required when the row addresses are denoted as absolute addresses. Thus, the memory requirements of the decoding method are reduced. Further, embedding one or more sets of spectral coefficients in the lookup table reduces the overhead of calculating the spectral coefficients at an execution stage.

Referring now to FIG. 3, a table 300 illustrating a part of a standard Huffman code book specified by an AAC standard is shown, in accordance with an embodiment of the present invention. The table 300 illustrates a part of the standard Huffman code book 1 specified by an AAC standard. In an embodiment of the present invention, the standard Huffman code book may be specified by an MP3 standard, a JPEG standard, or any other standard that uses Huffman encoding. The table 300 includes the columns 302a, 302b, and 302c. The column 302a includes a plurality of Huffman code words represented in hexadecimal format. The column 302b includes a plurality of lengths associated with a binary format of each of the plurality of Huffman code words. The column 302c includes a plurality of index values associated with each of the plurality of Huffman code words of the column 302a.

The table 300 is divided into a plurality of groups in which each group includes Huffman code words having equal lengths. In an embodiment of the present invention, the table 300 may be divided into groups having equal Huffman code word lengths by sorting the column 302b in ascending order. Further, each of the plurality of groups is rearranged based on numerical values of Huffman code words belonging to the particular group. In an embodiment of the present invention, each of the plurality of groups may be rearranged by sorting the column 302a in ascending order.

Referring now to FIGS. 4A, 4B, and 4C, a lookup table 400 in various stages of generation is shown, in accordance with an embodiment of the present invention. FIG. 4A shows the lookup table 400 in a first stage of generation in which the lookup table 400 includes the columns 402a, 402b, 402c, 402d, 402e, 402f, 402g, and 402h and rows 404a and 404b. FIG. 4B shows the lookup table 400 in a second stage of generation. In FIG. 4B, the lookup table 400 includes the rows 404c and 404d in addition to the rows 404a and 404b shown in FIG. 4A. FIG. 4C shows the lookup table 400 in a partially generated state in which the table 400 includes the rows 404e, 404f, 404g, 404h, 404i, 404j, 404k, and 404l in addition to the rows 404a, 404b, 404c and 404d shown in FIG. 4B.

The columns 402a, 402b, 402c, 402d, 402e, 402f, 402g, and 402h correspond to various binary combinations that are possible when at least three bits are extracted from an input bit stream. For example, the column 402a is labeled '000 ', the column 402b is labeled '001 ', the column 402c is labeled '010 ', and so forth. Various cells of the lookup table 400 store at least one of an intermediate value, a terminal value, and a data set. The intermediate value, the terminal value, and the data set may be differentiated from one another by the format in which they are represented. The intermediate value is represented such that a Least Significant Bit (LSB) is '0 ' denoting that the particular lookup table entry is an intermediate value. The remaining seven bits are used to represent an offset of a row that is to be accessed during a traversal of the lookup table. The terminal value is represented such that the LSB is set as '1 ' denoting that the particular lookup table entry is a terminal value. The next two bits after the LSB represent return bits that need to be returned to the input bit stream. For example, a Huffman code word obtained as a match during a lookup table traversal is four bits long. However, the traversal explained above must have involved two (2) three-bit extractions from the input bit stream. Therefore, the two extra bits extracted have to be returned to the input bit stream. The count of these extra bits is represented by the return bits in the terminal value. The remaining five Most Significant Bits (MSBs) represent an offset of a row that stores a data set. The data set may be at least one of a pair of quantized spectral coefficients, a quadruple of quantized spectral coefficients, and a plurality of scale factors. In an embodiment of the present invention, the data set may include any other data that may reduce calculation overhead at an execution stage. The calculation of the entries of the lookup table 400 is explained in detail in conjunction with FIG. 5.

Figure 5:
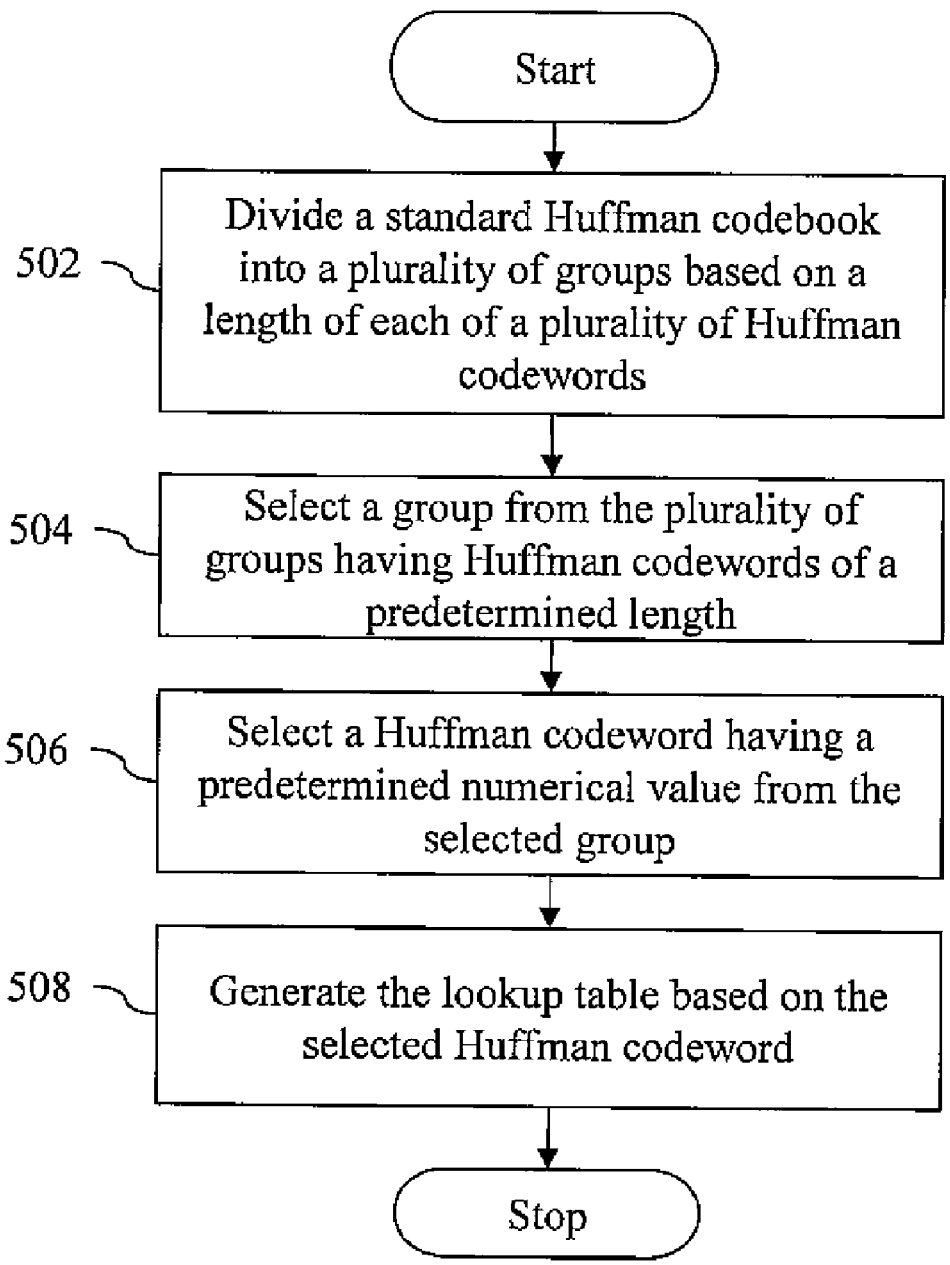
FIG. 5 is a flow chart illustrating a method for generating a lookup table, in accordance with an embodiment of the present invention.

Referring now to FIG. 5, a flow chart illustrating a method for generating a lookup table is shown, in accordance with an embodiment of the present invention.

At step 502, a standard Huffman code book is divided into a plurality of groups. Each of the plurality of groups includes Huffman code words having equal lengths. In an embodiment of the present invention, the standard Huffman code book may be specified by an AAC standard, an MP3 standard, a JPEG standard, or any other standard that uses Huffman encoding. For example, the table 300 shown in FIG. 3 illustrates a part of the Huffman code book 1 specified by the AAC standard. As explained earlier, the table 300 is divided into a plurality of groups by sorting entries of lengths in the column 302*b* in ascending order. The lengths are associated with a binary representation of Huffman code word entries of the column 302*a*. Further, each of the plurality of groups is rearranged by sorting the Huffman code words of the column 302*a* in ascending order based on their numerical values.

At step 504, a group is selected from the plurality of groups such that the selected group has Huffman code words of a predetermined length. In an embodiment of the present invention, the predetermined length may be a minimum length as compared to the lengths of all the Huffman code words. Referring to FIG. 3, a group represented by the row 304*a* is selected as it has Huffman code words of length '1', which is a minimum of all lengths of the remaining Huffman code words.

At step 506, a Huffman code word having a predetermined numerical value is selected from the selected group. In an embodiment of the present invention, the predetermined numerical value may be a minimum numerical value of all the numerical values of the Huffman code words belonging to the selected group. For example, Huffman code word '0' is selected from the group represented by the row 304*a*. At step 508, the look up table is generated based on the Huffman code word selected at step 506.

The method for generating a lookup table described in FIG. 5 will now be explained in detail in conjunction with FIGS. 3 and 4A. Referring to FIG. 3, a group represented by the row 304*a* is selected, which has Huffman code words with a minimum length. A Huffman code word '0' corresponding to the row 304*a* and the column 302*c* is selected. The Huffman code word selected corresponds to the columns 402*a*, 402*b*, 402*c*, and 402*d* of the lookup table 400. Thereafter, cell entries of cells corresponding to the columns 402*a*, 402*b*, 402*c*, and 402*d* and row 404*a* are calculated. Since, the Huffman code word selected corresponds to the columns 402*a*, 402*b*, 402*c*, and 402*d*, therefore cell entries should be terminal values. Hence, the LSBs for the cell entries is '1'. Further, since the Huffman code word length is one, therefore two bits are returned to the input bit stream. Hence, the return bits entries are '10'.

Further, a data set corresponding to the selected Huffman code word is stored in cells corresponding to the row 404*b* and the columns 402*a*, 402*b*, 402*c*, and 402*d*. Hereinafter cells present in a first half from the left side of a row will be referred to as a first set of cells. Similarly, cells present in the second half from the left of a row will be referred to as a second set of cells. When the data set is located in a first set of cells of a row that immediately follows a row that stores a terminal value, the row offset for such a row is '0'. Additionally, when the data set is located in a second set of cells of a row that immediately follows a row that stores a terminal value, the row offset for such a row is '1'. The data set for the Huffman code word '0' is located in the first set of cells of the row that immediately follows the terminal value row (the row 404*b* follows the row 404*a*). Therefore, offset bits representing a row offset of the row that stores the data set are set as '0'. A binary equivalent of the cell entries corresponding to terminal values is obtained by appending together 'offset bits', 'return bits', and the LSB. Thus, the terminal value may be represented as '0101' ('0x5' in hexadecimal format).

In an embodiment of the present invention, the data set is calculated using mathematical equations specified by an AAC standard. In another embodiment of the present invention, the data set may be calculated using mathematical equations specified by an MP3 standard, a JPEG standard, or any other standard that uses Huffman encoding. In one embodiment of the present invention, the data set may be at least one of a pair of quantized spectral coefficients, a quadruple of quantized spectral coefficients, and a plurality of scale factors. In another embodiment of the present invention, the data set may include any data that reduces calculation overhead during an execution stage.

The method for generating a lookup table described in FIG. 5 will now be explained in detail in conjunction with FIGS. 3 and 4B. Referring to FIG. 3, a group represented by the rows 304*b*, 304*c*, 304*d*, 304*e*, 304*f*, 304*g*, 304*h*, and 304*i* is selected. A Huffman code word '0x10' ('10000') belonging to the selected group is selected. The first three bits of the Huffman code word correspond to the column 402*e*. The remaining two bits of the Huffman code word correspond to the columns 402*a* and 402*b*. Therefore, during a traversal of the lookup table 400, the search will branch from the column 402*e* to the column 402*a* or to the column 402*b*. Hence, the cell entry for a cell corresponding to the column 402*e* and the row 404*a* is an intermediate value. Thus, a LSB of the cell entry is '0'. Further, since the row 404*c* stores a terminal value, the row offset is two. Hence, offset bits representing the row offset are set as '10'. A binary equivalent of the cell entries corresponding to the intermediate value is obtained by appending 'offset bits' to the LSB. Thus, the cell entry for a cell corresponding to the row 404*a* and the column 402*e* is '100' (0x4).

Further, the cell entries for cells corresponding to the row 404*c* and the columns 402*a*, and 402*b* need to be calculated. Further, the cell entries are terminal values. As the length of the Huffman code word selected is five, one bit needs to be returned to the input bit stream. Additionally, the data set corresponding to the selected Huffman code word is stored in cells corresponding to the row 404*d* and the columns 402*a*, 402*b*, 402*c*, and 402*d*. The above cells are a first set of cells of a row that immediately follows a row that stores the terminal value. Therefore, offset bits representing a row that stores a data set are set as '0'. Hence, the cell entries for cells corresponding to the row 404*c* and the columns 402*a*, and 402*b* is '0011' (0x3).

In an embodiment of the present invention, the data set is calculated using mathematical equations specified by an AAC standard. In another embodiment of the present invention the data set may be calculated using mathematical equations specified by an MP3 standard, a JPEG standard, or any other standard that uses Huffman encoding. In an embodiment of the present invention, the data set may be at least one of a pair of quantized spectral coefficients, a quadruple of quantized spectral coefficients, and a plurality of scale factors. In another embodiment of the present invention, the data set may include any data that reduces calculation overhead during an execution stage. The remaining entries of the lookup table 400 may be calculated based on the procedure explained above.

Figure 6:
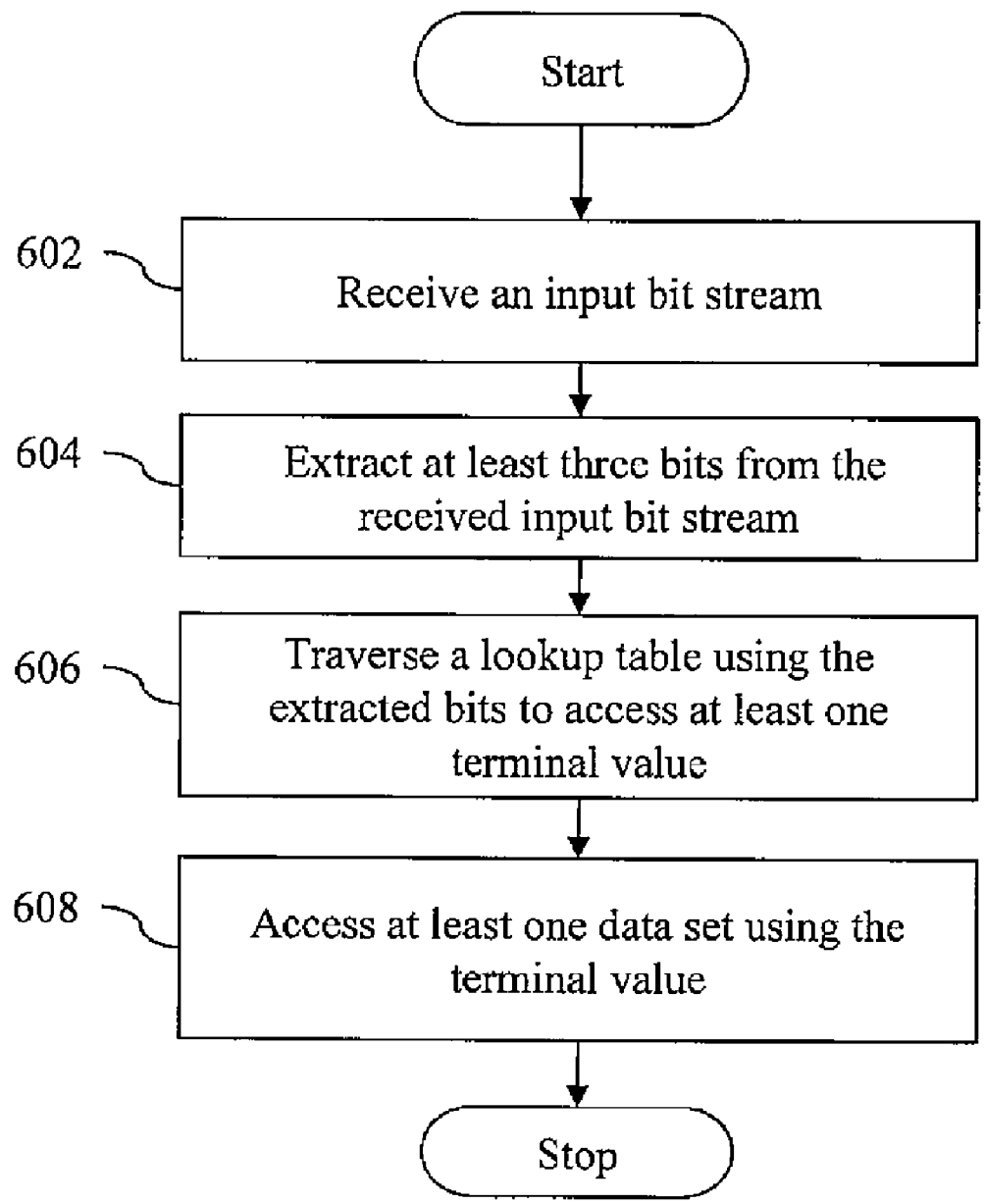
FIG. 6 is a flow chart illustrating a method for decoding an input bit stream, in accordance with an embodiment of the present invention.

Referring now to FIG. 6, a flow chart illustrating a method for decoding an input bit stream using a lookup table is shown, in accordance with an embodiment of the present invention.

At step 602, an input bit stream is received. At step 604, at least three bits are extracted from the received input bit stream. In an embodiment of the present invention, four or more bits may be extracted from the input bit stream. At step

606, the lookup table such as the lookup table 400 (refer to FIG. 4C) is traversed using the three bits extracted from the input bit stream. Thereafter, a terminal value is accessed based on the traversal of the lookup table. At step 608, at least one data set is accessed using the terminal value accessed above. The terminal value includes first offset bits that represent a row offset that includes the at least one data set corresponding to the Huffman code word.

The method for decoding an input bit stream explained in FIG. 6 will now be explained in conjunction with FIG. 4C. The three bits extracted from the input bit stream are '001'. A cell corresponding to the row 404*a* and the column 402*b* is accessed based on the three bits extracted from the input bit stream. A cell entry corresponding to the above cell location is '0x5' ('0101'). Since, the LSB is '1', it is determined that the cell entry is a terminal value. Further, since return bits are set as '10', two bits are returned to the input bit stream. Further, the first offset bits that represent a row offset of a row that stores a data set are set as '0', therefore the data set is located in the row 404*b* in a first set of cells.

Figure 7:
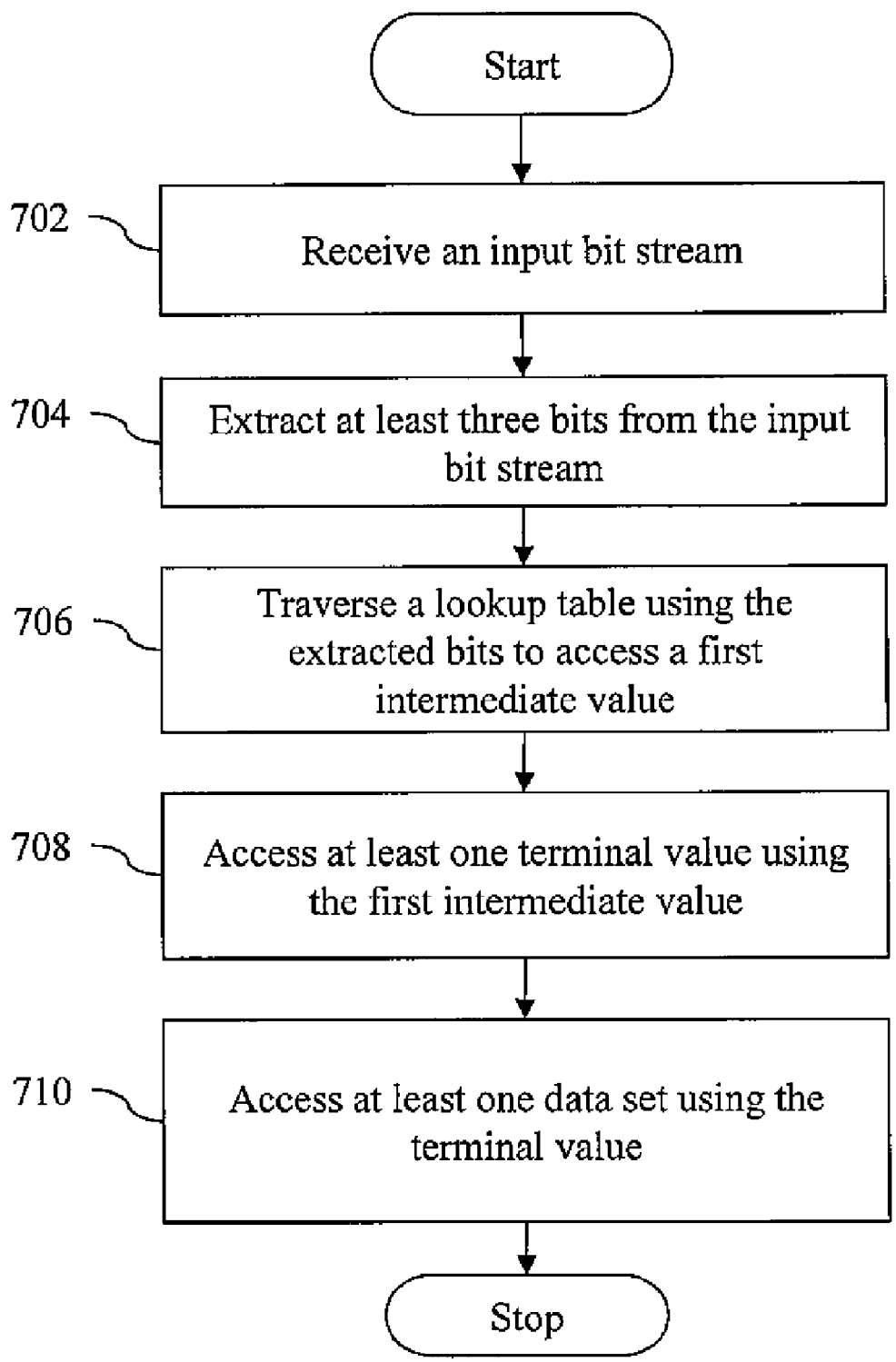
FIG. 7 is a flow chart illustrating a method for decoding an input bit stream, in accordance with another embodiment of the present invention.

Referring now to FIG. 7, a flow chart illustrating a method for decoding an input bit stream using a lookup table is shown, in accordance with another embodiment of the present invention.

At step 702, an input bit stream is received. At step 704, at least three bits are extracted from the received input bit stream. In an embodiment of the present invention, four bits or more may be extracted from the input bit stream. At step 706, a lookup table such as the lookup table 400 (refer to FIG. 4C) is traversed using the three extracted bits from the input bit stream. Thereafter, a first intermediate value is accessed based on the traversal of the lookup table. The first intermediate value includes second offset bits that represent an offset of a row that is to be accessed further. At step 708, a terminal value is accessed using the first intermediate value. The terminal value includes the first offset bits that represent an offset of a row including at least one data set. Further, the terminal value includes return bits that represent the number of bits to be returned to the input bit stream. At step 710, the at least one data set is accessed using the terminal value accessed above.

The method for decoding an input bit stream explained in FIG. 7 will now be explained in conjunction with FIG. 4C. A first group of three bits extracted from an input bit stream is '100'. A cell corresponding to the row 404*a* and the column 402*e* is accessed based on the first group of three bits extracted from the input bit stream. A cell entry corresponding to the above cell location is '0x4' ('0100'). Since, the LSB is '0', it is determined that the cell entry is an intermediate value. Hence, a second group of three bits is extracted from the input bit stream. The second group of three bits extracted from the input bit stream is '001'. Therefore, the column 402*b* is accessed using the second three extracted bits. Further, the second offset bits of the previously accessed intermediate value denote a row offset of a row to be accessed further. The row offset read is '10'. Hence, a cell corresponding to the row 404*c* and the column 402*b* is accessed. The cell entry at the above cell location is '0x3 ' (binary '011'). Since, the LSB is '1', it is determined that the cell entry is a terminal value. Further, since the return bits are '01 ', one bit is returned to the input bit stream. Further, as the row offset is '0', the data set is located in the row 404*d* in a first set of cells from the left of the row 404*d*.

Figure 8:
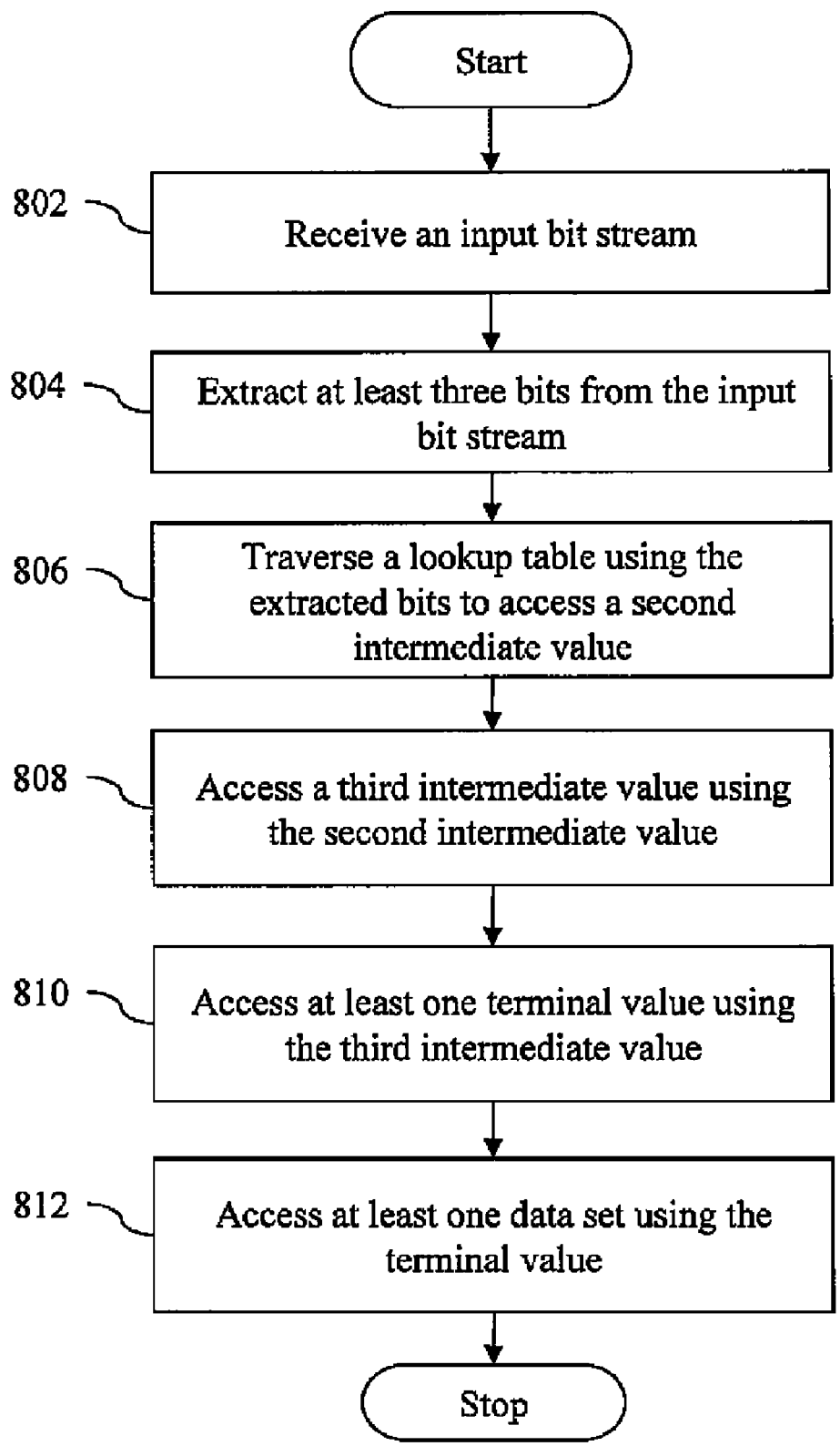
FIG. 8 is a flow chart illustrating a method for decoding an input bit stream, in accordance with yet another embodiment of the present invention.

Referring now to FIG. 8, a flow chart illustrating a method for decoding an input bit stream using a lookup table is shown, in accordance with yet another embodiment of the present invention.

At step 802, an input bit stream is received. At step 804, at least three bits are extracted from the received input bit stream. In an embodiment of the present invention, four or more bits may be extracted from the input bit stream. At step 806, a lookup table such as lookup table 400 (refer to FIG. 4C) is traversed using the three bits extracted from the input bit stream. Thereafter, a second intermediate value is accessed based on the traversal of the lookup table. The second intermediate value includes third offset bits that represent an offset of a row that is to be accessed further. At step 808, a third intermediate value is accessed using the second intermediate value. The third intermediate value includes fourth offset bits that represent an offset of a row that is to be accessed further. At step 810, a terminal value is accessed using the third intermediate value. The terminal value includes offset bits that represent an offset of a row including at least one data set. Further, the terminal value includes return bits that represent the number of bits to be returned to the input bit stream. At step 812, the at least one data set is accessed using the terminal value accessed above.

The method for decoding an input bit stream described in FIG. 8 will now be explained in conjunction with FIG. 4C. A first group of three bits extracted from an input bit stream is '110'. In an embodiment of the present invention, four or more bits may be extracted from the input bit stream. A cell corresponding to the row 404*a* and the column 402*g* is accessed using the first group of three bits extracted from the input bit stream. A cell entry corresponding to the above cell location is '0x10' ('10000'). Since, the LSB is '0', it is determined that the cell entry is an intermediate value. Hence, a second group of three bits is extracted from the input bit stream. The second group of three bits extracted from the input bit stream is '000'. Therefore, the column 402*a* is accessed based on the second group of three extracted bits. Further, the remaining bits of the previously accessed intermediate value denote a row offset of a row to be accessed. The row offset read is '1000'. Thus, a cell corresponding to the row 404*i* and the column 402*a* is accessed. The cell entry at the above cell location is '0x4' ('100'). Since, the LSB is '0', it is determined that the cell entry is an intermediate value. The remaining bits provide an offset of a row that is to be accessed further. The row offset read is '10'. Therefore, the row 404*k* is accessed. Further, as the last cell entry read is an intermediate value, a third group of three bits is extracted from the input bit stream. The third group of three extracted bits is '000'. A cell corresponding to the row 404*k* and the column 402*a* and is accessed based on the third group of three bits extracted. The cell entry at the above cell location is '0x5' ('0101'). Since, the LSB is '1', it is determined that it is a terminal value. The return bits are '10', hence two bits are returned to the input bit stream. Additionally, the first offset bits that represent an offset of a row including a data set are set as '0'. Therefore, the data set is located in the row 404*l* in a first set of cells.

Further, it should be understood by a person skilled in the art that a data set corresponding to a Huffman code word having a binary length greater than nine may require accessing three or more intermediate values. Therefore, a combination of the above-described method steps may be used to access the data set in such a situation.

Figure 9:
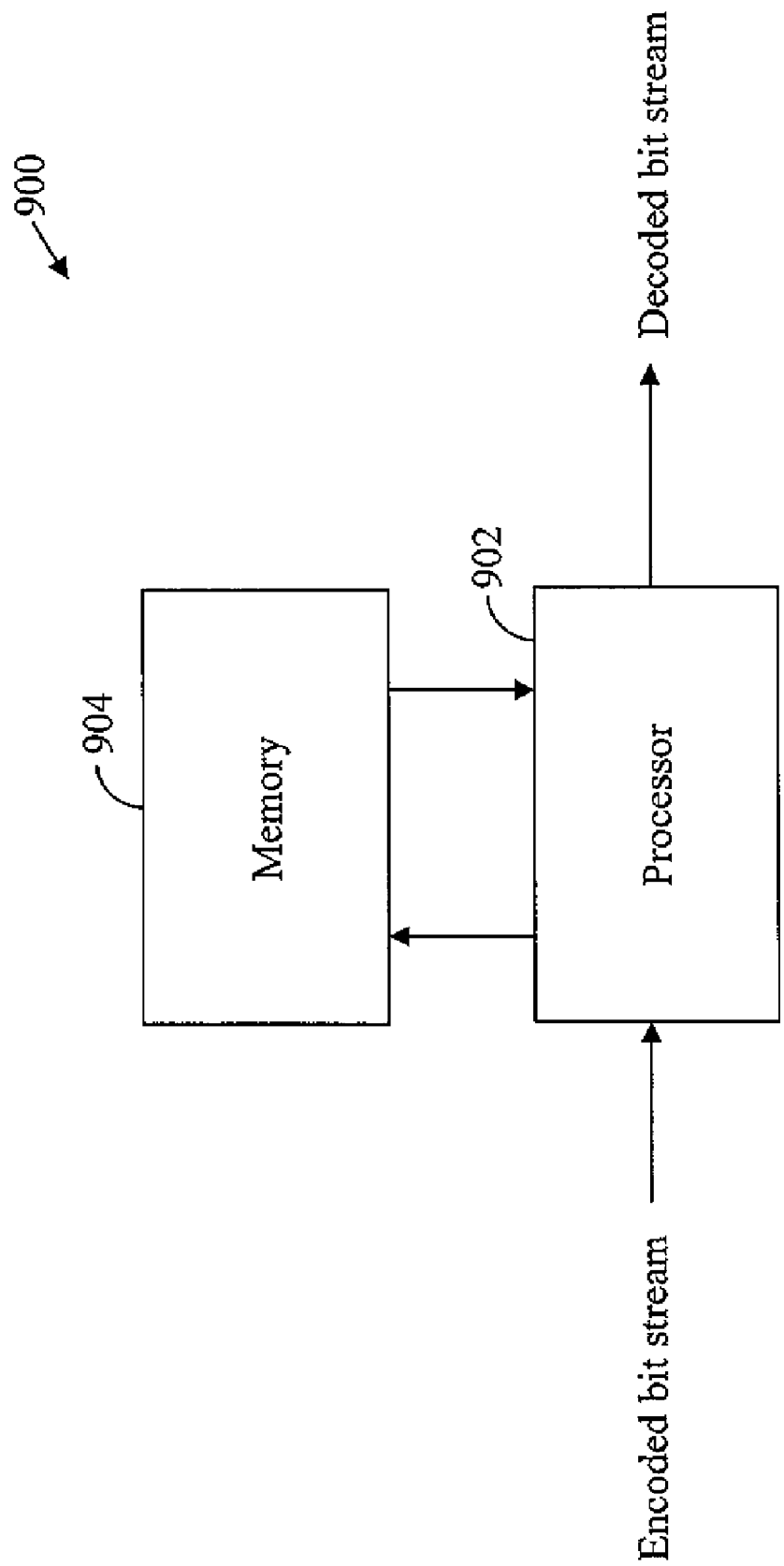
FIG. 9 is a schematic diagram illustrating a decoding system for decoding an input bit stream, in accordance with an embodiment of the present invention.

Referring now to FIG. 9, a schematic diagram illustrating a decoder system 900 for decoding an input bit stream encoded using Huffman encoding is shown, in accordance with an embodiment of the present invention. The decoder system 900 includes a processor 902 and a memory 904.

The processor 902 receives an input bit stream encoded using Huffman encoding. In an embodiment of the present invention, the input bit stream may be encoded using an AAC standard, an MP3 standard, a JPEG standard, or any standard that uses Huffman encoding. The processor 902 decodes the input bit stream using the steps or a combination of steps described in conjunction with FIGS. 6, 7, and 8. The memory 904 is coupled to the processor 902. The memory 904 stores a lookup table generated using a standard Huffman code book. In an embodiment of the present invention, the standard Huffman code book may be specified by an AAC standard, an MP3 standard, a JPEG standard, or any other standard that uses Huffman encoding. The steps of construction and the contents of the lookup table have been described in detail in conjunction with FIGS. 4A, 4B, 4C, and 5. Further, the memory 904 may hold a computer program for decoding the input bit stream, in accordance with various embodiments of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A method for generating a lookup table using a standard Huffman code book, wherein the standard Huffman code book comprises a plurality of Huffman code words, the method comprising:
   dividing the standard Huffman code book into a plurality of groups based on a length of each of the plurality of Huffman code words, wherein each of the plurality of groups comprises Huffman code words having equal lengths;
   selecting a group from the plurality of groups having Huffman code words of a predetermined length;
   selecting a Huffman code word having a predetermined numerical value from the selected group; and
   generating the lookup table based on the selected Huffman code word, wherein the lookup table comprises:
      at least one data set comprising decoded data corresponding to a Huffman code word of the plurality of Huffman code words; and
      at least one terminal value referring to the at least one data set, wherein the at least one terminal value comprises one or more first offset bits that represent a row offset of the at least one data set.

2. The method of claim 1, wherein the predetermined length is a minimum length associated with at least one Huffman code word, and the at least one Huffman code word belongs to the plurality of Huffman code words.

3. The method of claim 1, wherein the predetermined numerical value is a minimum numerical value associated with at least one Huffman code word, and the at least one Huffman code word belongs to the plurality of Huffman code words.

4. A method for decoding an input bit stream encoded using a Huffman encoding scheme using a lookup table, wherein the lookup table comprises at least one data set comprising decoded data corresponding to a Huffman code word, and at least one terminal value referring to the at least one data set, and wherein the at least one terminal value comprises one or more first offset bits that represent a row offset of the at least one data set, the decoding method comprising:
   receiving the input bit stream;
   extracting at least three bits from the received input bit stream;
   traversing the lookup table using the at least three extracted bits to access the at least one terminal value; and
   accessing the at least one data set using the at least one terminal value based on the traversal of the lookup table.

5. The method of claim 4, wherein the at least one terminal value further comprises at least two return bits representing extra bits extracted from the input bit stream that are not a part of the Huffman code word.

6. The method of claim 4, wherein the at least one data set further comprises at least one of a scale factor and a spectral coefficient.

7. The method of claim 4, wherein the lookup table further comprises a first intermediate value for providing an offset of the row to be accessed during the traversal of the lookup table, wherein the first intermediate value refers to the at least one terminal value and comprises one or more second offset bits that represent a row offset of the at least one terminal value.

8. The method of claim 7, further comprising traversing the lookup table based on the at least three extracted bits to access the first intermediate value.

9. The method of claim 8, further comprising accessing the at least one terminal value using the first intermediate value.

10. The method of claim 7, wherein the lookup table further comprises a second intermediate value and a third intermediate value for providing an offset of the row to be accessed during the traversal of the lookup table, wherein the second intermediate value refers to the third intermediate value and the third intermediate value refers to the at least one terminal value.

11. The method of claim 10, wherein the second intermediate value comprises one or more third offset bits that represent a row offset of the third intermediate value.

12. The method of claim 10, wherein the third intermediate value comprises one or more fourth offset bits that represent a row offset of the at least one terminal value.

13. The method of claim 10, further comprising traversing the lookup table based on the at least three extracted bits to access the second intermediate value.

14. The method of claim 13, further comprising accessing the third intermediate value using the second intermediate value.

15. The method of claim 14, further comprising accessing the at least one terminal value using the third intermediate value.

16. The method of claim 4, wherein the input bit stream is encoded according to at least one of an Advanced Audio Coding (AAC), a Moving Pictures Experts Group (MPEG) Audio Layer 3 (MP3), and a Joint Photographic Experts Group (JPEG) standards.

17. A system for decoding an input bit stream encoded using Huffman encoding scheme, comprising:
   a processor unit for decoding the input bit stream; and
   a memory unit coupled to the processor for storing a lookup table, wherein the lookup table comprises:
      at least one data set comprising decoded data corresponding to a Huffman code word; and
      at least one terminal value referring to the at least one data set, wherein the at least one terminal value comprises one or more first offset bits that represent a row offset of the at least one data set.

18. The system of claim 17, wherein the at least one terminal value further comprises at least two return bits, wherein the at least two return bits represent extra bits extracted from the input bit stream that are not a part of the Huffman code word.

19. The system of claim 17, wherein the at least one data set comprises at least one of a spectral coefficient and a scale factor.

20. The system of claim 17, wherein the lookup table further comprises one or more intermediate values, wherein at least one of the one or more intermediate values refers to the at least one terminal value.

\* \* \* \* \*